US009834434B2

(12) United States Patent
Kato

(10) Patent No.: US 9,834,434 B2
(45) Date of Patent: Dec. 5, 2017

(54) CAPACITIVE TRANSDUCER AND METHOD OF MANUFACTURING THE SAME

(71) Applicant: CANON KABUSHIKI KAISHA, Tokyo (JP)

(72) Inventor: Kazuhiko Kato, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 151 days.

(21) Appl. No.: 14/524,170

(22) Filed: Oct. 27, 2014

(65) Prior Publication Data
US 2015/0135841 A1    May 21, 2015

(30) Foreign Application Priority Data

Nov. 19, 2013    (JP) .................... 2013-239401

(51) Int. Cl.
| | |
|---|---|
| *B81B 7/00* | (2006.01) |
| *B06B 1/02* | (2006.01) |
| *B81B 3/00* | (2006.01) |
| *B81C 1/00* | (2006.01) |

(52) U.S. Cl.
CPC .......... *B81B 7/0041* (2013.01); *B06B 1/0292* (2013.01); *B81B 3/0021* (2013.01); *B81C 1/00182* (2013.01); *B81B 2201/0271* (2013.01); *B81C 2203/0145* (2013.01)

(58) Field of Classification Search
CPC ........... G01N 29/2406; B81C 1/00182; B81B 7/0041; B81B 3/0021; B81B 2201/0271; B81B 2203/0145; B81B 1/00182; B06B 1/0292
See application file for complete search history.

(56) References Cited

U.S. PATENT DOCUMENTS

| 5,982,709 A | 11/1999 | Ladabaum et al. |
|---|---|---|
| 2005/0157376 A1* | 7/2005 | Huibers ................ B82Y 30/00 359/291 |

(Continued)

OTHER PUBLICATIONS

Arif Sanh Ergun et al., "Capacitive Micromachined Ultrasonic Transducers: Fabrication Technology," 52(12) IEEE Transactions on Ultrasonics, Ferroelectrics, and Frequency Control 2242-2258 (Dec. 2005).

*Primary Examiner* — R. A. Smith
*Assistant Examiner* — John M Royston
(74) *Attorney, Agent, or Firm* — Fitzpatrick, Cella, Harper & Scinto

(57) ABSTRACT

Provided are a capacitive transducer that can make a sealing film thickness necessary to seal a gap smaller and can enhance performance such as a wider bandwidth, and a method of manufacturing the capacitive transducer. The capacitive transducer including cells each including a vibration film including a second electrode that is provided with a gap from a first electrode can be manufactured in the following manufacturing method. A convex part is formed on the first electrode, a sacrifice layer having a thickness larger than the thickness of the convex part is formed on the first electrode and the convex part, and a membrane is formed on the sacrifice layer. Further, an etching hole is formed in the membrane at a position above the convex part, the sacrifice layer is etched through the etching hole, and the etching hole is sealed by a sealing layer.

9 Claims, 8 Drawing Sheets

(56) References Cited

U.S. PATENT DOCUMENTS

| | | | |
|---|---|---|---|
| 2005/0200241 A1* | 9/2005 | Degertekin | G01N 29/2406 310/334 |
| 2009/0101997 A1* | 4/2009 | Lammel | G01L 9/0073 257/415 |
| 2009/0277271 A1* | 11/2009 | Seppa | G01N 29/022 73/627 |
| 2011/0163630 A1* | 7/2011 | Klootwijk | B06B 1/0292 310/300 |
| 2011/0221014 A1* | 9/2011 | Nakatani | B81C 1/00158 257/417 |

* cited by examiner

CAPACITIVE TRANSDUCER AND METHOD OF MANUFACTURING THE SAME

BACKGROUND OF THE INVENTION

Field of the Invention

The present invention relates to a capacitive transducer used as an ultrasonic transducer and a method of manufacturing the capacitive transducer.

Description of the Related Art

In recent years, along with development in microfabrication technology, various micro mechanical elements fabricated with micrometer-level precision are achieved. A capacitive-micromachined-ultrasonic-transducer (CMUT) is actively developed using such technology. The CMUT is an ultrasonic device that vibrates a lightweight vibration film to transmit and receive acoustic waves (hereinafter, represented by ultrasonic waves in some cases), and can be easily provided with excellent broadband characteristics even in liquid and in air. Accordingly, if the CMUT is used for a medical purpose, the CMUT can provide a highly accurate diagnosis comparing with that with a conventionally used ultrasonic device made of a piezoelectric element, and hence the CMUT attracts attention as an alternative thereto. Note that, herein, the acoustic waves include waves called sonic waves, ultrasonic waves, and photoacoustic waves. For example, the acoustic waves include photoacoustic waves that are generated inside of a subject by irradiating the inside of the subject with light (electromagnetic waves) such as visible light and infrared light.

A capacitive transducer includes a plurality of cell structures. Each cell structure includes, for example: a first electrode placed on a substrate made of Si or the like; a second electrode that is placed so as to be opposed to the first electrode; a gap formed between the first electrode and the second electrode; a vibration film that includes the second electrode and is made of a membrane formed on the gap; and a vibration film supporting part. The membrane has a structure for sealing the gap. The capacitive transducer is formed by laminating materials on the substrate made of Si or the like, according to an example manufacturing method therefor. In this method, the gap structure is formed in the following manner. A sacrifice layer material is deposited in advance in a portion to be changed to the gap, and then the sacrifice layer is removed by etching from an opening (etching hole) provided to part of the vibration film provided on the sacrifice layer. The capacitive transducer may be used in liquid such as water and oil. If such liquid invades the gap, vibration characteristics of the vibration film become lower, and hence it is necessary to seal the etching hole provided for forming the gap. According to a capacitive transducer described in Arif Sanli Ergun et al., IEEE Transactions on Ultrasonics, Vol. 52, No. 12, December 2005, 2242-2257, sealing is performed in the following manner. That is, a gap is sealed by depositing a film of silicon nitride through low-pressure-chemical-vapor-deposition (LP-CVD) in a flow path that is communicated with the gap below a vibration film from the etching hole. Due to the nature of an apparatus used for the LP-CVD, the silicon nitride film is deposited at a substantially uniform thickness from the etching hole to the gap through the flow path, and is deposited at a thickness corresponding to the thickness of the flow path, whereby the gap is sealed. Unfortunately, in this method, the silicon nitride film may be deposited even inside of the gap through the flow path, and vibration characteristics of the vibration film may be influenced.

According to a capacitive transducer described in U.S. Pat. No. 5,982,709, a gap is formed by removing a sacrifice layer from an etching hole, similarly to Arif Sanli Ergun et al., IEEE Transactions on Ultrasonics, Vol. 52, No. 12, December 2005, 2242-2257. Further, the gap is sealed by depositing a film in the etching hole through plasma-enhanced-chemical-vapor-deposition (PE-CVD). Unlike the LP-CVD, the film deposited through the PE-CVD does not invade the insides of the gap and the flow path, and the sealing film is formed so as to be deposited on the etching hole. Accordingly, in order to seal the gap, the deposited sealing film needs to be sufficiently thick for the thickness (height) of the gap.

The thickness of the sealing film for sealing the gap of the capacitive transducer needs to be about three times the thickness of the gap. Accordingly, as the thickness of the gap becomes larger, the necessary sealing film thickness also becomes larger. Meanwhile, a reduction in membrane thickness for performance enhancement is demanded, and a configuration that enables a reduction in sealing film thickness is desired.

SUMMARY OF THE INVENTION

In view of the above-mentioned problem, the present invention provides a method of manufacturing a capacitive transducer including a cell including: a first electrode; and a vibration film including a second electrode that is provided with a gap from the first electrode. The method includes: forming a convex part on the first electrode; forming a sacrifice layer on the first electrode and the convex part, and the sacrifice layer having a thickness larger than a thickness of the convex part; forming a membrane on the sacrifice layer; forming an etching hole in the membrane at a position above the convex part; etching the sacrifice layer through the etching hole; sealing the etching hole; and forming the second electrode. Alternatively, the method includes: forming a sacrifice layer on the first electrode; forming a membrane on the sacrifice layer; forming an etching hole in the membrane; etching the sacrifice layer through the etching hole; forming a convex part in a bottom part of the etching hole; sealing the etching hole; and forming the second electrode.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

In the present invention, a gap is formed by removing a sacrifice layer that is provided in advance in a portion to be changed to the gap, from an etching hole provided to a membrane. Further, the gap is sealed at the etching hole by a sealing film. At this stage, a convex part is formed in a bottom part of the etching hole. When the sealing film is formed after sacrifice layer etching, the sealing film is formed by contacting a film that grows from the convex part and a film that grows from the etching hole wall. Hence, the thickness of the sealing film can be made smaller.

Figure 1A:
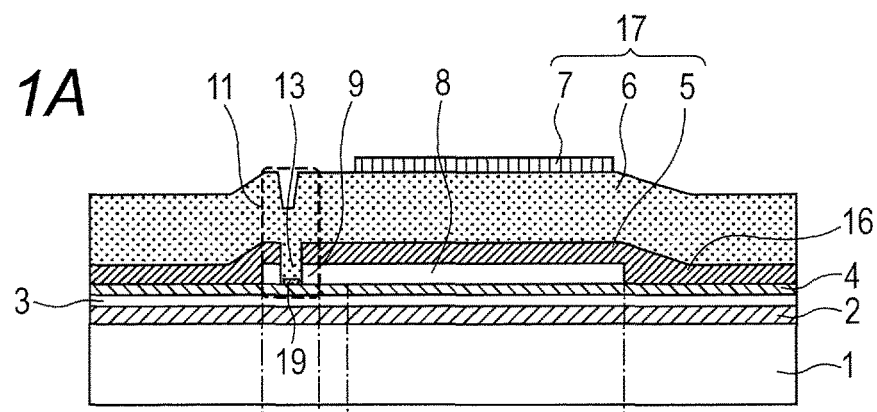
FIGS. 1A, 1B, and 1C are diagrams for describing an example capacitive transducer of the present invention.
Figure 1B:
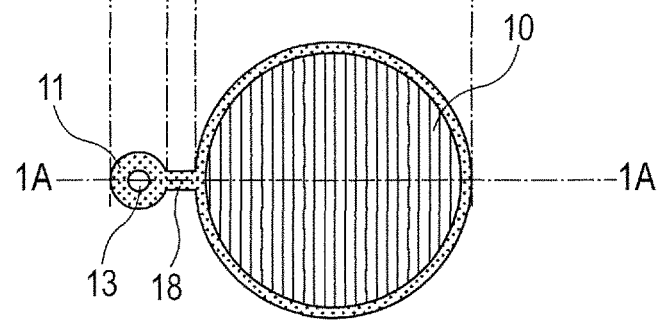
Figure 1C:
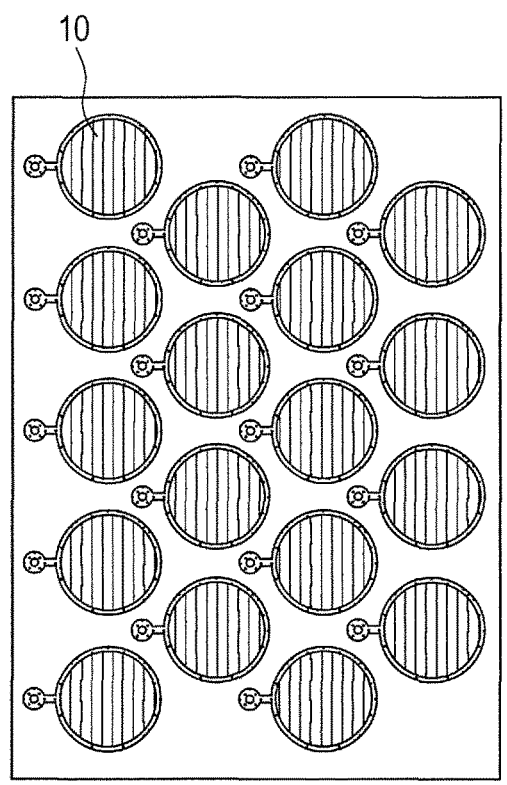

Hereinafter, an embodiment of the present invention is described with reference to FIG. 1A to FIG. 1C. FIG. 1A is a cross-sectional view of a capacitive transducer of the present embodiment, which is taken along 1A-1A, and FIG. 1B is a top view of FIG. 1A. Although FIG. 1A and FIG. 1B illustrate only one cell structure 10, the number of the cell structures 10 in the capacitive transducer may be a given number as illustrated in FIG. 1C. The arrangement of the cells may be any other arrangement than the arrangement illustrated in FIG. 1C. As illustrated in FIG. 1A to FIG. 1C, the shape of each vibration film of the capacitive transducer of the present embodiment is circular, but the shape may be quadrangular, hexagonal and other shapes.

A configuration of the capacitive transducer of the present invention is described. The capacitive transducer includes a substrate 1 made of Si or the like, an insulating film 2 formed on the substrate 1, a first electrode 3 formed on the insulating film 2, and an insulating film 4 formed on the first electrode 3. The capacitive transducer further includes a vibration film 17 on the insulating film 4 with a gap (cavity) 8 being formed therebetween. The vibration film 17 includes a first membrane 5, a second membrane 6 and a second electrode 7. The first membrane 5 is supported by a vibration film supporting part 16. In the case where the substrate 1 is an insulator such as a glass substrate, the insulating film 2 may be omitted.

Figure 2A:
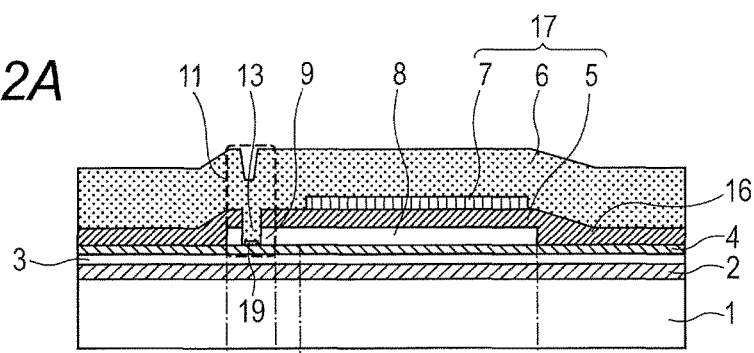
FIGS. 2A and 2B are diagrams for describing an example capacitive transducer of the present invention.
Figure 2B:
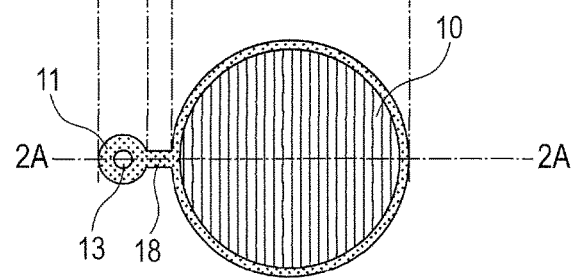

Although the second electrode 7 is formed on the second membrane 6 in FIG. 1A, the second electrode 7 may be placed between the first membrane 5 and the second membrane as illustrated in FIG. 2A. According to the configuration illustrated in FIG. 2A and FIG. 2B, the distance between the first electrode and the second electrode can be made shorter, the capacitance of the capacitive transducer can be made larger, and the performance thereof can be more enhanced. The capacitive transducer further includes a voltage applying unit that applies voltage to between the first electrode 3 and the second electrode 7. Hence, the capacitive transducer can vibrate the vibration film 17 by applying the voltage to between the first electrode 3 and the second electrode 7, so the capacitive transducer can transmit ultrasonic waves. Moreover, if the capacitive transducer is subjected to ultrasonic waves in the state where bias voltage is applied to between the electrodes, the capacitive transducer can receive the ultrasonic waves.

The gap 8 of the capacitive transducer is formed according to a sacrifice layer etching technique. In this technique, a sacrifice layer is placed in advance in a portion to be changed to the gap, and the sacrifice layer is removed by etching from an etching hole opened in the membrane. Specifically, a sacrifice layer 12 (see, for example, FIG. 4F to be described later) is formed in a portion in which the vibration part gap 8 is to be formed and a portion in which an etching hole part gap 9 is to be formed. The sacrifice layer 12 includes a portion of a flow path 18 that connects the etching hole part gap 9 and the vibration part gap 8. Then, the first membrane 5 and the vibration film supporting part 16 are formed on the sacrifice layer 12, and an etching hole 13 for removing the sacrifice layer is then formed in the first membrane 5 at a position above the etching hole part gap 9. Subsequently, the gap 8 is formed by removing the sacrifice layer 12 from the etching hole 13 by the sacrifice layer etching. After the gap formation, a sealing film 11 that doubles as the second membrane 6 is deposited in the etching hole 13, whereby the etching hole 13 is sealed.

Here, the inside of the gap (cavity) 8 is held in a reduced pressure state. The sealing film 11 is deposited in the etching hole 13 in a chamber in which the pressure can be reduced, whereby the reduced pressure state of the cavity 8 can be held. These steps are performed in a reduced pressure process (vacuum process).

It is desirable that, in particular, a material used to form the gap part (for example, the insulating film 4) among materials used to manufacture the capacitive transducer have low surface roughness, in order to prevent the vibration film 17 from coming into contact with the lower surface of the gap 8 during its vibrations. Metal materials such as titanium, aluminum, and molybdenum can be used for the first electrode 3. In particular, titanium is desirable, because a change in roughness of titanium due to an influence of heat applied during the process is small and because the etching selectivity thereof with respect to a sacrifice layer material and a material used to form the vibration film is high. A silicon oxide film or the like can be used for the insulating film 4. In particular, a silicon oxide film formed by using a PE-CVD apparatus has low surface roughness. Further, the silicon oxide film can be formed at a low temperature of 400° C. or lower, and hence an influence of heat on the other constituent materials can be reduced. The first membrane 5 and the second membrane 6 of the vibration film 17 and the vibration film supporting part 16 are insulating films. In particular, a silicon nitride film formed by using the PE-CVD apparatus can be formed at a low temperature of 400° C. or lower, and hence an influence of heat on the other constituent materials can be reduced. Moreover, the films can be formed at a low tensile stress of 300 MPa or less, and hence large deformation of the vibration film due to residual stress of the membranes can be prevented.

The second membrane 6 needs to fulfill a function of sealing the gap by being deposited on the etching hole 13, in addition to a function as the vibration film. It is desired that a material used to seal the gap have a high coverage property, in order to seal the gap by being deposited on the etching hole 13. In addition, it is also desired that the sealing film do not invade the inside of the vibration part gap 8 from the etching hole 13 through the flow path 18. This is because, if the sealing film invades the inside of the vibration part gap 8, the thickness of the vibration part gap 8 that influences the performance changes. For example, a silicon nitride film formed through LP-CVD is unfavorable, because the film invades the inside of the gap through the flow path, hence the thickness of the gap part changes. A material that satisfies desired sealing film conditions can be the silicon nitride film formed through the PE-CVD.

With regard to a material of the sacrifice layer for forming the gap, it is desirable to select a material that can be relatively easily removed in the sacrifice layer etching step and has sufficiently high etching selectivity with respect to the other constituent materials. It is also desirable to select a material having a small influence on roughness in a heating step at the time of forming the membrane. For example, metal materials such as chromium and molybdenum and amorphous silicon can be selected as a material that satisfies the above-mentioned requirements. In particular, chromium can be easily etched by a mixed solution of ceric ammonium nitrate and perchloric acid. Further, chromium has sufficiently high etching selectivity with respect to titanium (the material of the first electrode 3), silicon oxide (the material of the insulating film 4) and the silicon nitride film (the material of the membranes), which are constituent materials in the sacrifice layer etching step. Accordingly, in the sacrifice layer etching step, the gap can be formed while damage to the other materials than the sacrifice layer material is suppressed.

The sacrifice layer includes: a portion of the vibration part gap 8, which is the gap in a portion in which the vibration film vibrates; a portion of the etching hole part gap 9, through which the solution for removing the sacrifice layer invades during the sacrifice layer etching; and a portion of the flow path 18 that connects these portions. With regard to the thickness of each portion, because the portion of the vibration part gap 8 corresponds to the portion in which the vibration film vibrates, the thickness of this portion is set according to design specifications. Because the solution for removing the sacrifice layer needs to invade the inside of the gap in the sacrifice layer etching step, the lower limit of the thickness of each of the portions of the etching hole part gap and the flow path is determined by a film thickness that enables the sacrifice layer etching. The lower limit cannot be determined as one value, because it depends on the material of the sacrifice layer and a solvent for removing the sacrifice layer. In the case where the sacrifice layer is made of chromium and where the sacrifice layer etching is performed using the mixed solution of ceric ammonium nitrate and perchloric acid, the thickness of the sacrifice layer can be equal to or less than 100 nm. Moreover, the width of the etching hole part gap can be larger than the width of the etching hole. With this configuration, the etchant is introduced through the etching hole without any problem, the sacrifice layer etching is excellently performed, and the subsequent sealing film deposition is excellently performed. The second electrode 7 is a material constituting part of the vibration film 17, and thus needs to be a material having a relatively small stress. For example, titanium and aluminum or the like can be used therefor.

Figure 3A:
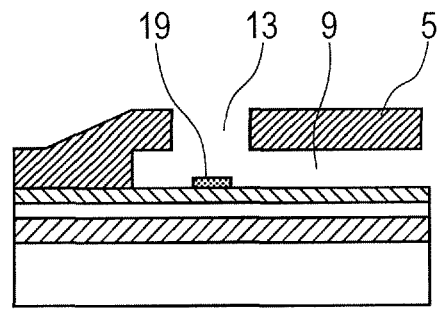
FIGS. 3A, 3B, 3C, and 3D are cross-sectional views for describing a principle of the present invention.
Figure 3B:
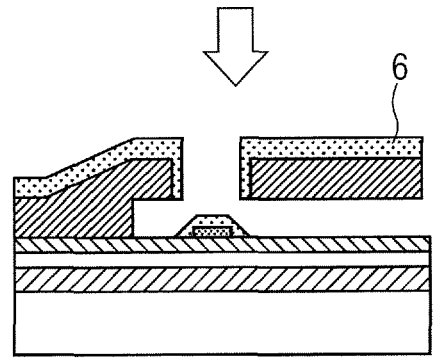
Figure 3C:
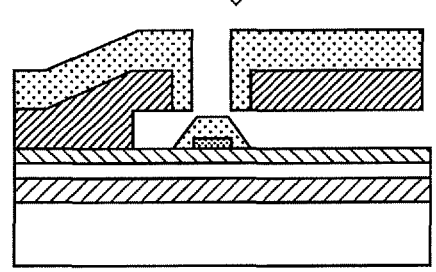
Figure 3D:
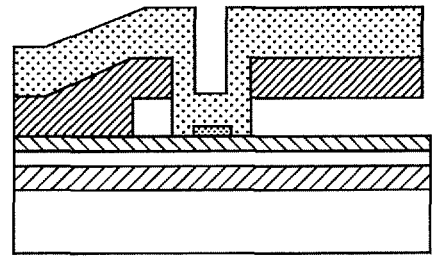

After the gap is formed by the sacrifice layer etching, the sealing film is deposited on the etching hole 13, whereby the gap is sealed. This process is described with reference to FIG. 3A to FIG. 3D. At this stage, a convex part 19 is formed in a bottom part of the etching hole. FIG. 3A to FIG. 3D illustrate a process in which the sealing film made of the second membrane 6 is deposited on the etching hole 13 after the sacrifice layer 12 is removed by the sacrifice layer etching, whereby the gap is sealed. As a film is formed on the etching hole 13 through the PE-CVD, the film is gradually deposited on each of the convex part 19 in the bottom part of the etching hole and the side surface and the upper surface of the first membrane 5 in which the etching hole 13 is opened (FIG. 3A to FIG. 3C). The film deposited on the convex part 19 in the bottom part of the etching hole is connected to the film deposited on the side surface (wall) of the first membrane 5, and the two films become a continuous film, whereby the etching hole is sealed (FIG. 3D). At this time, the film thickness necessary for the sealing depends on the distance between the convex part 19 in the bottom part of the etching hole and the opening side surface of the membrane 5 in the portion in which the etching hole is formed.

In such a manner as described above, the capacitive transducer is manufactured, the capacitive transducer including the cell structures each including the vibration film including the second electrode that is provided with the gap from the first electrode, the gap being formed by etching the sacrifice layer through the etching hole. In the capacitive transducer thus configured, the convex part is formed in the bottom part of the etching hole, and the sealing film is formed on the convex part through the etching hole, whereby the etching hole is sealed. The convex part and the sealing film may be made of the same material, and may be made of different materials. In the capacitive transducer of the present embodiment, the distance between the convex part 19 in the bottom part of the etching hole and the side surface of the membrane 5 is appropriately set without changing the thickness of the vibration part gap 8 that influences the performance. This can make the sealing film thickness necessary to seal the gap 8 smaller, and enhances the sealing reliability.

In the present invention, the thickness of the convex part is selected in consideration of the thickness of the sacrifice layer 12 corresponding to the thickness of the cavity 8.

In consideration of process controllability and efficiency, the thickness of the sacrifice layer 12 is generally set to a range of 50 nm to 200 nm, and can be set to a range of 70 nm to 150 nm.

The thickness of the convex part needs to be set to be smaller than the thickness of the sacrifice layer 12. The thickness of the convex part is generally set to a range of 10 nm to 150 nm, and can be set to a range of 20 nm to 100 nm.

Assuming that the thickness direction of the convex part is a Z direction, the length of the convex part (corresponding to the size of the convex part) in an X direction and a Y direction orthogonal to the Z direction is selected in consideration of the size (diameter) of the etching hole.

The size (diameter) of the etching hole is set as appropriate in consideration of the performance of the transducer that depends on the thickness of the vibration film, the size (diameter) of the vibration film, and the thickness of the cavity.

Under the circumstances, assuming that the diameter of the etching hole is E and that the thickness of the sacrifice layer 12 corresponding to the thickness of the cavity 8 (gap) is G, it is desirable that a size (diameter) P of the convex part in the X direction and the Y direction be selected so as to satisfy the following (Expression 1).

$$P \leq E - 2G \quad \text{(Expression 1)}$$

Example 1

Hereinafter, Example 1 of the capacitive transducer according to the present invention is described. FIG. 4A to FIG. 4K illustrate a process flow of a capacitive transducer having a structure of the present example. Although FIG. 4A to FIG. 4K illustrate the capacitive transducer including only one cell structure 10, the number of the cell structures 10 in the capacitive transducer may be a given number as described above. Moreover, although FIG. 4A to FIG. 4K illustrate that one etching hole part is formed in one cell structure 10, the number of etching holes formed in one cell structure 10 may be a given number.

The capacitive transducer of the present example includes: a silicon substrate 1 having a thickness of 300 μm;

an insulating film 2 that is formed on the silicon substrate 1 and is made of a thermally oxidized film; a first electrode 3 that is formed on the insulating film 2 and is made of titanium; and an insulating film 4 that is formed on the first electrode 3 and is made of a silicon oxide film. The capacitive transducer of the present example has the cell structure 10 including: a gap formed between the first electrode 3 and a second electrode 7; a vibration film 17 formed on the gap; and a vibration film supporting part 16 that supports the vibration film 17. The vibration film 17 includes: a first membrane 5 formed on the gap; a second membrane 6 for sealing the gap; and the second electrode 7, and includes a voltage applying unit that applies voltage to between the first electrode 3 and the second electrode 7.

Figure 4A:
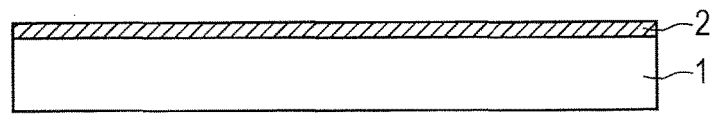
FIGS. 4A, 4B, 4C, 4D, 4E, 4F, 4G, 4H, 4I, 4J, and 4K are cross-sectional views for describing an example method of manufacturing the capacitive transducer of the present invention.
Figure 4B:
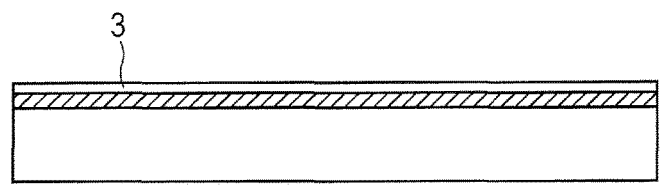
Figure 4C:
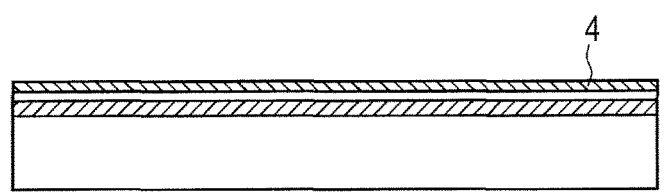
Figure 4D:
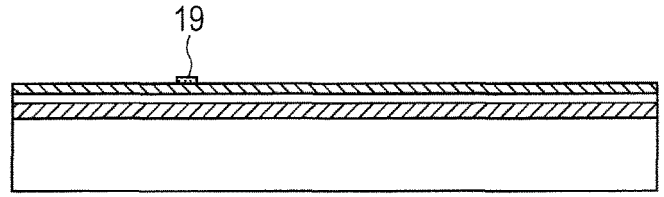
Figure 4E:
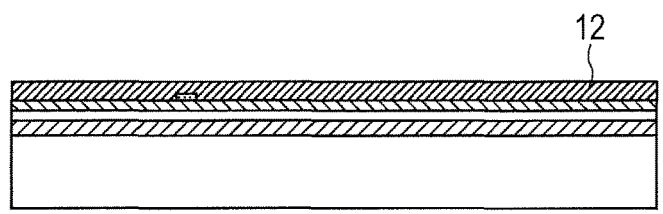
Figure 4F:
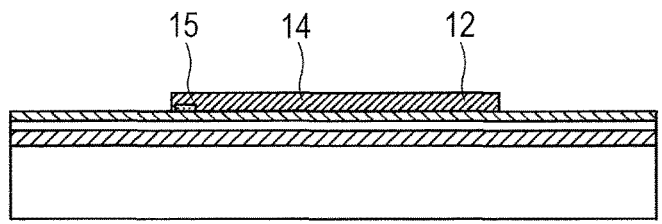

The gap part of the capacitive transducer of the present example is formed by performing a sacrifice layer etching step illustrated in FIG. 4D to FIG. 4H. First, the insulating film 2 made of the thermally oxidized film, the first electrode 3 made of titanium, and the insulating film 4 made of the silicon oxide film are formed in the stated order on the silicon substrate 1. Subsequently, a projection part to be changed to a convex part 19 in a bottom part of the etching hole is formed at a thickness of 20 nm by photolithography and dry etching with $CF_4$ gas (FIG. 4D). The convex part 19 can be formed by $SiO_2$, SiN, and other materials. Subsequently, a film of chromium as a sacrifice layer material is formed at a thickness of 200 nm on the insulating film 4. A portion in which the etching hole for removing a sacrifice layer 12 is to be formed is etched into a thickness of 80 nm by photolithography and dry etching with $Cl_2$ gas (FIG. 4E). Subsequently, patterning is performed by photolithography and dry etching with $Cl_2$ gas such that an etching hole part sacrifice layer 15 to be changed to the etching hole part and a vibration part sacrifice layer 14 to be changed to the vibration part remain (FIG. 4F). Up to this step, a structure in which the thickness of the gap is different between the etching hole part and the vibration part can be formed. Note that this difference in thickness is not expressed in FIG. 4F.

Figure 4G:
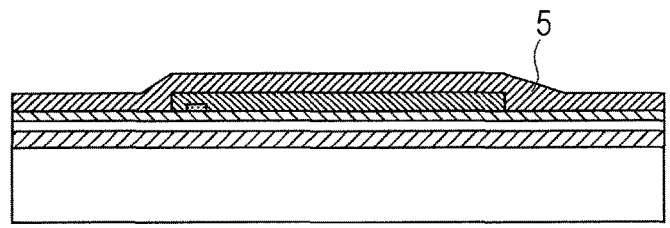
Figure 4H:
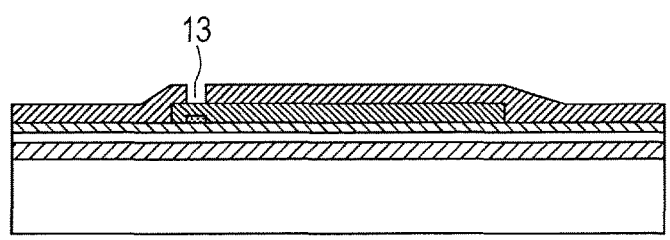
Figure 4I:
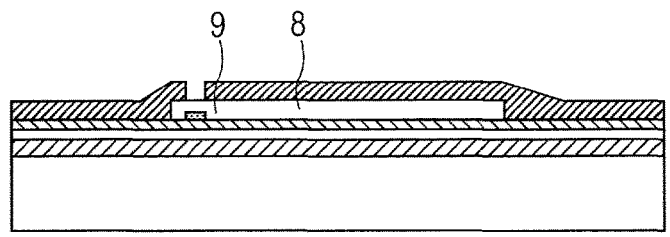
Figure 4J:
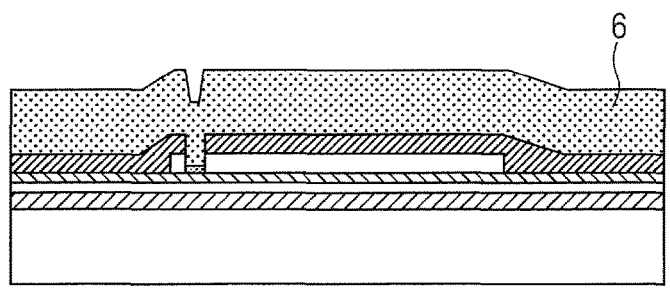
Figure 4K:
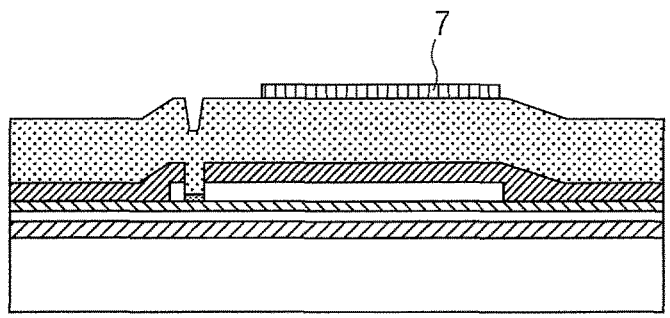
Figure 5A:
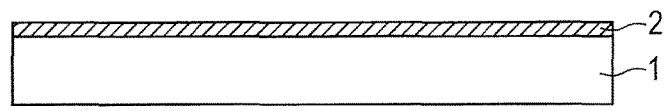
FIGS. 5A, 5B, 5C, 5D, 5E, 5F, 5G, 5H, 5I, 5J, and 5K are cross-sectional views for describing an example method of manufacturing the capacitive transducer of the present invention.
Figure 5B:
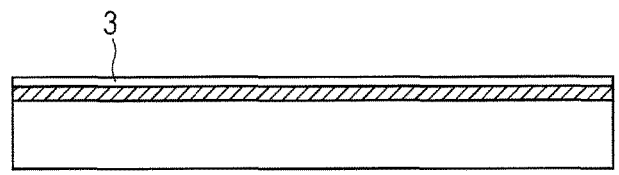
Figure 5C:
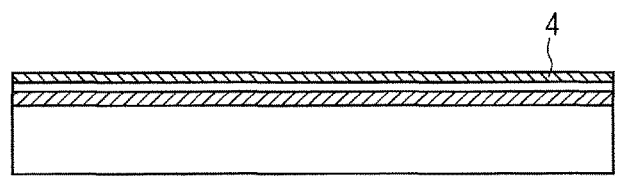
Figure 5D:
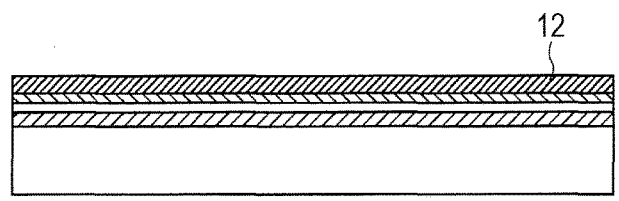
Figure 5E:
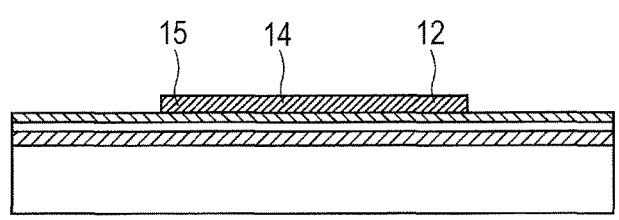
Figure 5F:
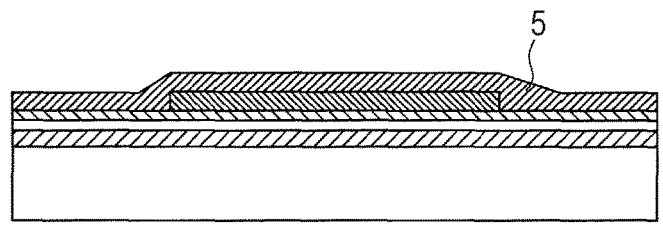
Figure 5G:
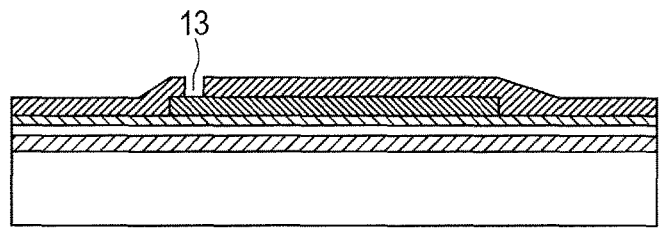
Figure 5H:
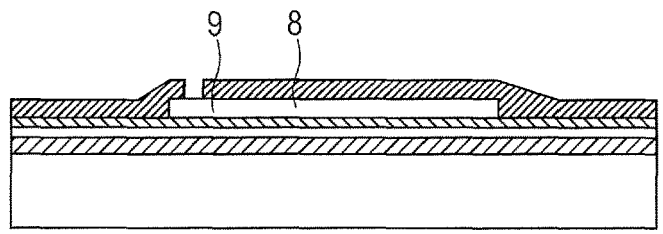
Figure 5I:
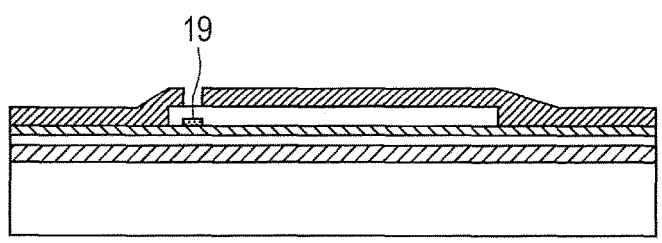
Figure 5J:
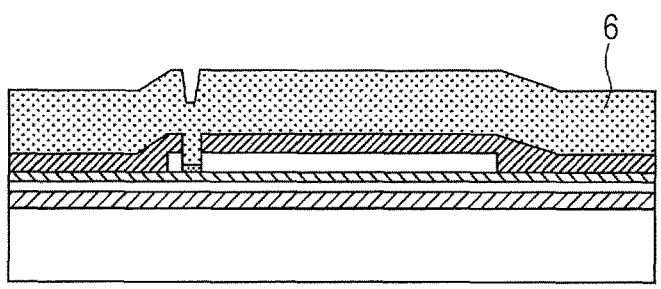
Figure 5K:
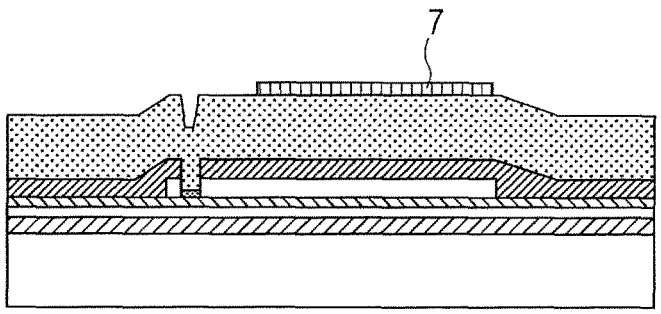

Subsequently, the first membrane 5 and a silicon nitride film to be changed to the vibration film supporting part 16 are formed at a thickness of 400 nm on the sacrifice layer 12, using a PE-CVD apparatus (FIG. 4G). Subsequently, the first membrane is patterned by photolithography and dry etching with $CF_4$ gas, whereby an etching hole 13 is formed (FIG. 4H). Subsequently, a mixed solution of ceric ammonium nitrate and perchloric acid is introduced from the etching hole 13, and the sacrifice layer 12 is removed, whereby a gap including a vibration part gap 8 and an etching hole part gap 9 is formed (FIG. 4I). Then, a silicon nitride film to be changed to the second membrane 6 is formed at a thickness of 300 nm on the etching hole 13, using the PE-CVD apparatus. As a result of this step, the gap part is sealed at the etching hole 13 (FIG. 4J). Lastly, the second electrode 7 is formed on the second membrane 6 (FIG. 4K).

In the present example, the thickness of the sacrifice layer 12 is different between the etching hole part and the vibration part. The thickness of the sacrifice layer 12 is 80 nm in the etching hole part, and is 200 nm in the vibration part. In a conventional configuration, a sealing film thickness necessary to seal the gap is about three times the thickness of the gap. Accordingly, in the conventional configuration, the sealing film thickness necessary to seal the gap is three times the thickness (80 nm) of the etching hole part gap, that is, about 240 nm. In comparison, in the configuration of the present example, the convex part 19 in the bottom part of the etching hole can make a sealing film thickness necessary to seal the gap 8 smaller, and enhances the gap sealing performance.

Example 2

A capacitive transducer of Example 2 of the present invention is described with reference to FIG. 5A to FIG. 5K. The present example is different from Example 1 in that the convex part 19 is formed in the bottom part of the etching hole after the sacrifice layer etching is performed. A process illustrated in FIG. 5A to FIG. 5E is the same as the process illustrated in FIG. 4A to FIG. 4F, except that the convex part 19 is not formed in the process illustrated in FIG. 5A to FIG. 5E. In the present example, in FIG. 5I, a metal film is formed by photolithography at a thickness of 20 nm in the bottom part of the etching hole, after the sacrifice layer etching is performed. Here, an Au film, an Al film, and other films can be adopted for the metal film.

That is, the convex part 19 of Example 2 is formed as a metal convex part in the bottom part of the etching hole, by: patterning a resist; then forming a metal film by deposition; and lifting off the resist. The convex part thus formed can produce effects equivalent to the effects of Example 1. In the present example, the second electrode 7 is also formed when the metal convex part 19 is formed, and the second electrode 7 can be formed between the first membrane 5 and the second membrane 6. In this case, because the convex part 19 and the second electrode 7 are formed at the same time, the process can be simplified.

Example 3

Figure 6A:
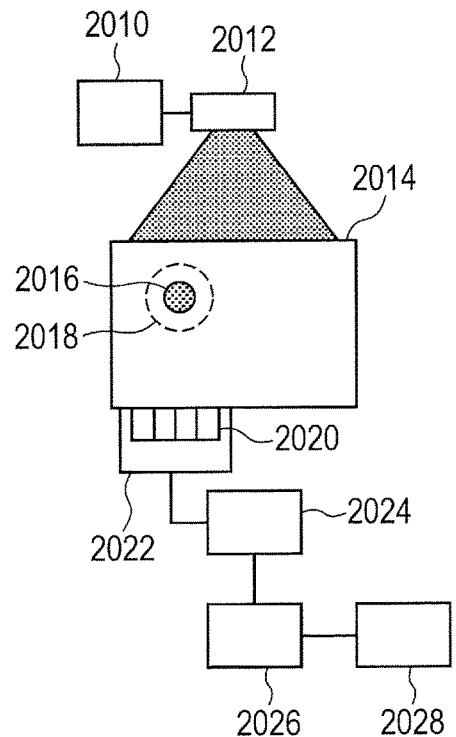
FIGS. 6A and 6B are diagrams for describing an example information acquiring apparatus including the capacitive transducer of the present invention.

FIG. 6A illustrates an example subject information acquiring apparatus using a photoacoustic effect. Pulsed light emitted from a light source 2010 passes through an optical member 2012 such as a lens, a mirror, and an optical fiber, and a subject 2014 is irradiated with the pulsed light. A light absorber 2016 provided inside of the subject 2014 absorbs energy of the pulsed light, and generates photoacoustic waves 2018 that are acoustic waves. A capacitive transducer 2020 of the present invention provided inside of a probe 2022 receives the photoacoustic waves 2018, converts the photoacoustic waves 2018 into electric signals, and outputs the electric signals to a signal processing unit 2024. The signal processing unit 2024 performs signal processing such as A/D conversion and amplification on the received electric signals, and outputs the processed signals to a data processing unit 2026. The data processing unit 2026 acquires, as image data, subject information (characteristic information in which optical characteristic values of the subject, such as a light absorption coefficient, are reflected) using the received signals. Here, the signal processing unit 2024 and the data processing unit 2026 are collectively referred to as processing unit. A display unit 2028 displays an image based on the image data received from the data processing unit 2026. As described above, the subject information acquiring apparatus of the present example includes: the capacitive transducer of the present invention; and the processing unit that acquires the subject information using the electric signals received from the transducer. The transducer receives the acoustic waves from the subject, and outputs the electric signals.

Figure 6B:
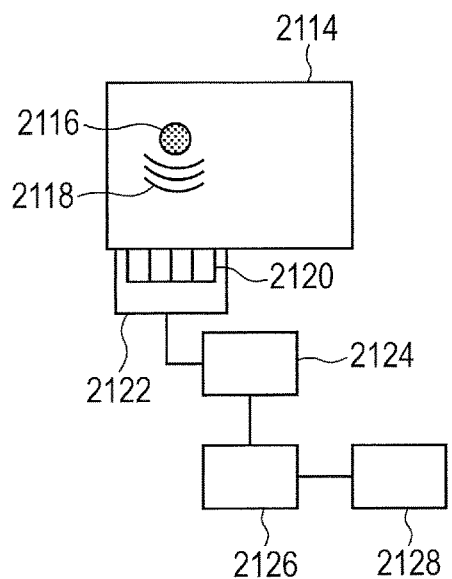

FIG. 6B illustrates a subject information acquiring apparatus such as an ultrasonographic diagnostic apparatus using reflection of acoustic waves. A capacitive transducer 2120 of the present invention provided inside of a probe 2122 transmits acoustic waves to a subject 2114, and the acoustic waves are reflected on a reflector 2116. The transducer 2120 receives the reflected acoustic waves (reflected waves) 2118, converts the reflected waves 2118 into electric signals, and outputs the electric signals to a signal processing unit 2124. The signal processing unit 2124 performs signal processing such as A/D conversion and amplification on the received electric signals, and outputs the processed signals to a data processing unit 2126. The data processing unit 2126 acquires, as image data, subject information (characteristic information in which a difference in acoustic impedance is reflected) using the received signals. Also in this example, the signal processing unit 2124 and the data processing unit 2126 are collectively referred to as processing unit. A display unit 2128 displays an image based on the image data received from the data processing unit 2126. As described above, the subject information acquiring apparatus of the present example includes: the capacitive transducer of the present invention; a light source; and the data processing unit. Then, the transducer receives the photoacoustic waves generated by radiating the subject with the light emitted from the light source, and converts the received waves into the electric signals. The data processing unit acquires the subject information using the electric signals.

Note that the probe may be mechanically moved for scanning, and may be of handheld type, that is, may be moved by a user such as a doctor and an operator with respect to the subject. Moreover, in the case of the apparatus using the reflected waves as illustrated in FIG. 6B, a probe for transmitting acoustic waves may be provided separately from a probe for receiving acoustic waves. Further, both the functions of the apparatuses of FIG. 6A and FIG. 6B may be provided to one apparatus, and both the subject information in which optical characteristic values of the subject are reflected and the subject information in which a difference in acoustic impedance is reflected may be acquired. In this case, the transducer 2020 of FIG. 6A may be capable of not only the photoacoustic wave reception but also both the acoustic wave transmission and the reflected wave reception.

According to the present invention, a structure including a convex part in a bottom part of an etching hole is obtained after sacrifice layer etching, and hence the convex part and an edge part of the etching hole are close to each other. Accordingly, during sealing film formation, a film that grows from the bottom surface and a film that grows from the etching hole wall come into contact with each other in a short time, and the thickness of the formed sealing film can be made smaller. That is, even in a structure having the same gap thickness as a conventional gap thickness, the sealing film thickness necessary to seal a gap can be made smaller. As a result, the gap can be sealed using a film thickness smaller than a conventional film thickness, and this enables a reduction in vibration film thickness and can enhance performance such as a wider bandwidth.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-239401, filed Nov. 19, 2013, which is hereby incorporated by reference herein in its entirety.

What is claimed is:

1. A method of manufacturing a capacitive transducer including a cell including: a first electrode; and a vibration film including a second electrode that is provided with a gap from the first electrode, the method comprising:
    forming a convex part on or above the first electrode;
    forming a sacrifice layer on or above the first electrode and the convex part, the sacrifice layer having a thickness larger than a thickness of the convex part;
    forming a membrane on the sacrifice layer;
    forming an etching hole in the membrane at a position above the convex part;
    etching the sacrifice layer through the etching hole;
    sealing the etching hole; and
    forming the second electrode,
    wherein a diameter of the convex part is smaller than that of the etching hole, and
    wherein a material used in the sealing of the etching hole covers the convex part and seals the etching hole.

2. The method of manufacturing the capacitive transducer according to claim 1, wherein the convex part is formed by $SiO_2$ or SiN.

3. The method of manufacturing the capacitive transducer according to claim 1, wherein the thickness of the convex part is 10 nm to 150 nm.

4. The method of manufacturing the capacitive transducer according to claim 3, wherein the thickness of the convex part is 20 nm to 100 nm.

5. The method of manufacturing the capacitive transducer according to claim 1, wherein $P \leq E-2G$, where P is a diameter of the convex part, E is a diameter of the etching hole, and G is the thickness of the sacrifice layer.

6. The method of manufacturing the capacitive transducer according to claim 1, wherein the second electrode is formed after the etching hole is sealed.

7. The method of manufacturing the capacitive transducer according to claim 1, wherein, in the sealing of the etching hole, the material deposited on the convex part contacts the material deposited on a side surface of the membrane to form a continuous film.

8. The method of manufacturing the capacitive transducer according to claim 7, the sealing comprises depositing the material by a chemical vapor deposition method.

9. The method of manufacturing the capacitive transducer according to claim 1, the convex part is formed on an insulating film on the first electrode.

* * * * *